United States Patent
Takebe

(10) Patent No.: US 6,641,960 B2
(45) Date of Patent: Nov. 4, 2003

(54) PHOTOSENSITIVE SOLUTION FOR FORMING PICTURE CELL

(75) Inventor: Kazuo Takebe, Toyonaka (JP)

(73) Assignee: Sumitomo Chemical Company, Limited, Osaka (JP)

(*) Notice: Subject to any disclaimer, the term of this patent is extended or adjusted under 35 U.S.C. 154(b) by 266 days.

(21) Appl. No.: 09/901,033

(22) Filed: Jul. 10, 2001

(65) Prior Publication Data

US 2002/0022186 A1 Feb. 21, 2002

(30) Foreign Application Priority Data

Jul. 11, 2000 (JP) ........................................ 2000-209506

(51) Int. Cl.⁷ ............................ G02B 5/20; G03F 7/004
(52) U.S. Cl. .......................................... 430/7; 430/270.1
(58) Field of Search .................................. 430/270.1, 7

(56) References Cited

U.S. PATENT DOCUMENTS 5,721,077 A * 2/1998 Takao et al. .................... 430/7

FOREIGN PATENT DOCUMENTS

| JP | 8-220328 A | * | 8/1996 |
| JP | 10260309 | | 9/1998 |
| JP | 11014824 | | 1/1999 |
| JP | 11-024245 A | * | 1/1999 |

* cited by examiner

Primary Examiner—John A. McPherson
(74) Attorney, Agent, or Firm—Birch, Stewart, Kolasch & Birch, LLP

(57) ABSTRACT

A photosensitive solution comprising a colorant, a binder, a photoactive compound and a solvent, wherein the solvent can dissolve a dried film formed from a photosensitive solution in 5 minutes or shorter when the dried film is immersed in the solvent, the amount of the solvent being 10 times by weight based on the amount of the dried film, is provided; and by using the photosensitive solution, even when application of the solution is conducted with a coater of slit and spin system, formation of the dried colored matter adhered to a color filter can be suppressed, frequency of the washing can be reduced, and the productivity can be improved.

10 Claims, No Drawings

PHOTOSENSITIVE SOLUTION FOR FORMING PICTURE CELL

BACKGROUND OF THE INVENTION

The present invention relates to a photosensitive solution for forming a picture cell used in a color liquid crystal display apparatus, image pick-up tube and the like, and to a color filter formed by using the photosensitive solution. More particularly, it relates to a photosensitive solution capable of forming a picture cell excellent in transmittance and contrast, and to a color filter formed by using the photosensitive solution.

A color filter in a color liquid crystal display apparatus, image pick-up tube and the like is usually produced by forming picture cells of each of three primary colors, red, green and blue, on a substrate, such as glass plate, film plate, silicon wafer, or the like. Usually, a black matrix (a shielding layer) is formed in order to shield a light among the colored picture cells. A colored picture cell of each color can be formed according to the following method. A photosensitive solution dispersing a pigment of the color is applied uniformly by a spin coater on a substrate on which a shielding layer pattern was formed, then, the applied film is heated for drying (pre-bake) to obtain a dried film. Thereafter, the dried film is subjected to a patterning exposure, followed by developing and heating (post-bake) to obtain a colored picture cell. By repeating the above procedure for each color required in a color filter, a color filter having the required colors can be obtained. For forming a black matrix, a photosensitive solution containing a black pigment can be used.

In recent years, a saving liquid coater, such as those of slit and spin system and extrusion coaters, has been used as a coater used in a production of color filter. Such a saving liquid coater requires a smaller amount of photosensitive solution for coating it than a conventional spin coater. Therefore, it is economically advantageous. However, when such a saving liquid coater is used, a dried matter of the photosensitive solution-tends to adhere to the color filter, and yield of the color filter tends to lower. For preventing this problem, the dried colored matter adhered at the slit part is removed by washing the slit part with a solvent in prescribed times. However, the problem cannot be prevented sufficiently even when the washing is conducted very often, and more effective method is desired for improving the productivity.

The present inventors has conducted intensive studies on a solvent used in a photosensitive solution for forming a colored picture cell. As a result, they have found that by using a specific solvent, for the washing, which can dissolve, by immersing, a dried film formed from a photosensitive solution in a specific time, formation of the dried colored matter adhered to a color filter can be suppressed, frequency of the washing can be reduced, and the productivity can be improved. The present invention was completed based on this finding.

SUMMARY OF THE INVENTION

The present invention provide a practically excellent photosensitive solution comprising a colorant, a binder, a photoactive compound and a solvent, wherein the solvent can dissolve a dried film formed from a photosensitive solution in 5 minutes or shorter when the dried film is immersed in the solvent, the amount of the solvent being 10 times by weight based on the amount of the dried film.

EMBODIMENT OF THE INVENTION

The colorant used in the photosensitive solution of the present invention can be at least one selected from pigments and dyes. The pigments and dyes can be organic colorants or inorganic colorants usually used in this field.

As such inorganic colorants, metal compounds such as metal oxides and metal complex salts can be exemplified. Specific examples thereof include a metal oxide and a complex metal oxide of iron, cobalt, aluminum, cadmium, lead, copper, titan, magnesium, chromium, zinc, antimony or the like. As such organic colorants, compounds classified in pigments in Colour index (The Society of Dyers and Clolurists) are preferably used. Specific examples of the organic colorants include compounds of the following colour index (C.I.) number, although organic colorants usable in the present invention are not limited to the compounds:

C.I. Acid red 73;
C.I. Direct red 1, 23, 89;
C.I. Pigment yellow 20, 24, 31, 53, 83, 86, 93, 94, 109, 110, 117, 125, 137, 138, 139, 147, 148, 150, 153, 154, 166 and 173;
C.I. Pigment orange 13, 31, 36, 38, 40, 42, 43, 51, 55, 59, 61, 64 65, and 71;
C.I. Pigment red 9, 97, 105, 122, 123, 144, 149, 166, 168, 176, 177, 180, 192, 215, 216. 224, 242, and 254
C.I. Pigment violet 14, 19, 23, 29, 32, 33, 36, 37 and 38;
C.I. Pigment blue 15 (15:3, 15:4, 15:6 など), 21, 22, 28, 60 and 64:
C.I. Pigment green 7, 10, 15, 25, 36 and 47;
C.I. Pigment brown 28; and
C.I. Pigment black 1 and 7.

When the colorant is a pigment, the pigment can be, if necessary, subjected to a rosin treatment, a surface treatment using a pigment derivative having an acidic group or a basic group, or the like, a fine particle treatment such as the one by kneader fine particle method, a washing for removing impurities with an organic solvent, water or the like.

Such a colorant is used in an amount of preferably 5–60% by weight, more preferably 10–50% by weight base on the total solid contents of the photosensitive solution. If a colorant used for modifying color is used together, the above amount is the total of both colorants.

The binder polymer makes the unexposed part of the coated film alkali soluble and acts as a dispersing medium for a pigment. The binder polymer can be selected from various polymers used in this field. This binder polymer is preferably a copolymer having a carboxyl group. As the copolymer having a carboxyl group, particularly, copolymers obtained from a carboxyl group-containing monomer and other monomer copolymerizable therewith are preferably used.

The carboxyl group-containing monomer can be, for example, an unsaturated carboxylic acid having at least one carboxyl group in the molecule, such as an unsaturated monocarboxylic acid and unsaturated dicarboxylic acid. Specific examples thereof include acrylic acid, methacrylic acid, crotonic acid, itaconic acid, maleic acid and fumaric acid. These carboxyl group-containing monomers can be used each alone or In combination of two or more. The monomer copolymerizable with such carboxyl group-containing monomers is a compound having a polymerizable carbon-carbon unsaturated bond. Specific examples thereof include aromatic vinyl compounds such as α-methylstyrene, vinyltoluene and the like, unsaturated carboxylates such as methyl (meth)acrylate, ethyl (meth)

acrylate, butyl (meth)acrylate, 2-hydroxylethyl (meth)acrylate, benzyl (meth)acrylate and the like, unsaturated aminoalkyl carboxylates such as aminoethyl acrylate and the like, unsaturated glycidyl carboxylates such as glycidyl (meth)acrylate and the like, vinyl carboxylates such as vinyl acetate and vinyl propionate and the like, vinyl cyanide compounds such as (meth)acrylonitrile and α-chloroacrylonitrile, and the like. These monomers can also be used each alone or in combination of two or more. In this copolymer, the carboxyl group-containing monomer is used in an amount of preferably from 10 to 50% by weight, more preferably from 15 to 40% by weight based on the total amount of monomers.

Preferable specific examples of such copolymer having a carboxyl group include benzyl methacrylate/methacrylic acid copolymer, benzyl methacrylate/methacrylic acid/styrene copolymer, methyl methacrylate/methacrylic acid copolymer, methyl methacrylate/methacrylic acid/styrene copolymer and the like. These copolymer shaving a carboxyl group preferably have weight-average molecular weight measured by gel permeation chromatography converted to polystyrene of from 5000 to 400000, more preferably from 10000 to 300000. The binder resin is used in an amount of usually from 5 to 90% by weight, preferably from 20 to 70% by weight based on the total amount of all solid components (that is, amount of photosensitive solution excepting amount of solvent) in the photosensitive solution.

The solvent used in the present invention is a solvent which can dissolve a dried film formed from the photosensitive solution in 5 minutes or shorter when the dried film is immersed in the solvent, the amount of the solvent being 10 times by weight based on the amount of the dried film.

Kind of the solvent used in the present invention varies according to kinds of the ingredients in the photosensitive solution such as the binder and the colorant.

The solvent used in the present invention can be selected from ethylene glycol monoalkyl ethers such as ethylene glycol monomethyl ether, ethylene glycol monoethyl ether, ethylene glycol monopropyl ether and ethylene glycol monobutyl ether; diethylene glycol dialkyl ethers such as diethylene glycol dimethyl ether, diethylene glycol diethyl ether, diethylene glycol dipropyl ether and diethylene glycol dibutyl ether; ethylene glycol alkyl ether acetates such as methylcellosolve acetate and ethylcellosolve acetate; alkylene glycol alkyl ether acetates such as propylene glycol monomethyl ether acetate, propylene glycol monoethyl ether acetate, propylene glycol monopropyl ether acetate, methoxybutyl acetate and methoxypentyl acetate; aromatic hydrocarbons such as benzene, toluene and xylene; ketones such as methyl ethyl ketone, acetone, methyl amyl ketone, methyl isobutyl ketone and cyclohexanone; alcohols such as ethanol, propanol, butanol, hexanol, cyclohexanol, ethylene glycol and glycerine; esters such as ethyl 3-ethoxypropionate and methyl 3-methoxypropionate; cyclic esters such as γ-butyrolactone; and the like.

The solvent used In the present invention is preferably a solvent which can dissolve a dried film formed from the photosensitive solution in 3 minutes or shorter, more preferably one minute or shorter, when the dried film is immersed in the solvent, the amount of the solvent being 10 times by weight based on the amount of the dried film.

These solvents can be used each alone or in combination of two or more as long as the solvents dissolve a dried film formed from the photosensitive solution in 5 minutes or shorter when the dried film is immersed in the solvents. The amount of the solvent used is preferably from 50 to 90% by weight, more preferably from 60 to 85% by weight based on the amount of the whole photosensitive solution including the solvent.

As the photoactive compound in the photosensitive solution of the present invention, mixtures of a photopolymerization initiator and a phtopolymerizable monomer can be used. In general, the phtopolymerizable monomer is a compound polymerizable by the action of light and the photopolymerization initiator, and has a polymerizable carbon-carbon unsaturated bond. It can be a bi-functional, or other poly-functional monomer as well as a mono-functional monomer.

Specific examples of the mono-functional monomer include nonylphenylcarbitol acrylate, 2-hydroxy-3-phenoxypropyl acrylate, 2-ethylhexylcarbitol acrylate, 2-hydroxyethyl acrylate, N-vinylpyrrolidone and the like. Specific examples of the bi-functional monomer include 1,6-hexanediol di(meth)acrylate, ethylene glycol di(meth)acrylate, neopentyl glycol di(meth)acrylate, triethylene glycol di(meth)acrylate, bis(acryloyloxyethyl) ether of bisphenol A, 3-methylpentanediol di(meth)acrylate and the like. Examples of the other poly-functional monomer include trimethylolpropane tri(math)acrylate, pentaerythritol tri(meth)acrylate, pentaerythritol tetra(meth)acrylate, dipentaerythritol penta(meth)acrylate, dipentaerythritol hexa(meth)acrylate and the like.

These photopolymerizable monomers can be used each alone or in combination of two or more. It is preferred that at least one bi-functional or other poly-functional monomer is used. The amount of the photopolymerizable monomers is generally from 0.1 to 60 parts by weight, preferably from 1 to 30 parts by weight based on 100 parts by weight of the total amount of a binder resin and the photopolymerizable monomers Photopolymerization initiator usually used in this field can be used in the present invention. Examples thereof include acetophenone-based initiators, benzoin-based initiators, benzophenone-based initiators, thioxanetone-based initiators, triazine-based initiators and other initiators. Specific examples of the acetophenone-based initiator include oligomers of diethoxyacetophenone, 2-hydroxy-2-methyl-1-phenylpropane-1-one, benzyldimethylketal, 2-hydroxy-2-methyl-1-[4-(2-hydroxyethoxy)phenyl]propane-1-one, 1-hydroxycyclohexylphenylketon 2-methyl-2-morpholino-1-(4-methylthiophenyl)propane-1-one, 2-benzyl-2-dimethylamino-1-(4-morpholinophenyl)butane-1-one and 2-hydroxy-2-methyl-1-[4-(1-methylvinyl)phenyl] propane-1-one, and the like.

Specific examples of the benzoin-based initiators include benzoin, benzoin methyl ether, benzoin ethyl ether, benzoin isopropyl ether, benzoin isobutyl ether and the like. Specific examples of the benzophenone-based initiator include benzophenone, methyl o-benzoylbenzoate, 4-phenylbenzophenone, 4-benzoyl-4'-methyldiphenylsulfide, 3,3',4,4'-tetra(tert-butylperoxycarbonyl)benzophenone, 2,4,6-trimethylbenzophenone and the like. Specific examples of the thioxanetone-based initiator include 2-isopropylthioxanetone, 4-isopropylthioxanetone, 2,4-diethylthioxanetone, 2,4-dichlorothioxanetone, 1-chloro-4-propoxythioxanetone and the like.

Specific examples of the triazine-based initiator include 2,4-bis(trichloromethyl)-6-(4-methoxyphenyl)-1,3,5-triazine, 2,4-bis(trichloromethyl)-6-(4-methoxynaphthyl)-1,3,5-triazine, 2,4-bis(trichloromethyl)-6-piperonyl-1,3,5-triazine, 2,4-bis(trichloromethyl)-6-(4-methoxystyryl)-1,3,5-triazine, 2,4-bis(trichloromethyl)-6-[2-(5-methylfuran-2-yl)ethenyl]-1,3,5-triazine, 2,4-bis(trichloromethyl)-6-[2-(furan-2-yl)ethenyl]-1,3,5-triazine, 2,4-bis(trichloromethyl)-6-[2-(4-diethylamino-2-methylphenyl)

ethenyl]-1,3,5-triazine, 2,4-bis(trichloromethyl)-6-[2-(3,4-dimethoxyphenyl)ethenyl]-1,3,5-triazine and the like. Specific examples of the other initiator include 2,4,6-trimethylbenzoyldiphenylphosphine oxide, 2,2'-bis(o-chlorophenyl)-4,4',5,5'-tetraphenyl-1,2'-biimidazole, 10-butyl-2-chloroacridone, 2-ethylanthraquinone, benzil, 9,10-phenanethrenequinone, camphorquinone, methyl phenylglyoxylate, titanocene compounds and the like. These photopolymerization initiators can be used each alone or in combination of two or more.

A photopolymerization aid can also be combined with a photopolymerization initiator. As the photopolymerization aid, for example, amine-based aids and alkoxyanthracene-based aids are listed. Specific examples thereof include triethanolamine, methyldiethanolamine, triisopropanolamine, methyl 4-dimethylaminobenzoate, ethyl 4-dimethylaminobenzoate, isoamyl 4-dimethylaminobenzoate, 2-dimethylaminoethyl benzoate, 2-ethylhexyl 4-dimethylaminobenzoate, N,N-dimethylparatoluidine, 4,4'-bis(dimethylamino) benazophenone (commonly called Michler's ketone), 4,4'-bis(diethylamino)benzophenone, 9,10-dimethoxyanthracene, 2-ethyl-9,10-dimethoxyanthracene, 9,10-diethoxyanthracene, 2-ethyl-9,10-diethoxyanthracene and the like. These photopolymerization aids can also be used each alone or in combination of two or more.

Total amount of the photopolymerization initiator and the photopolymerization aid, if any, is generally from 3 to 30 parts by weight, preferably from 5 to 25 parts by weight based on 100 parts by weight of the total amount of a binder polymer, and the photopolymerizable monomrs.

The photosensitive solution of the present invention may also contain additives, if necessary. Specific examples of such additives include fillers, other polymer compounds, surfactants (pigment dispersing agent), adherence promoters, antioxidants, ultraviolet absorbers, coagulation preventing agents and the like.

More specific examples thereof include fillers such as glass, silica, alumina and the like; other polymer compounds such as polyvinyl alcohol, polyacrylic acid, polyethylene glycolmonoalkyl ether, polyfluoroalkyl acrylate and the like: nonionic, cationic and anionic surfactants; adherence promoters such as vinyltrimethoxysilane, vinyltriethoxysilane, vinyltris(2-methoxyethoxy)silane, N-(2-aminoethyl)-3-aminopropylmethyldimethoxysilane. N-(2-aminoethyl)-3-aminopropyltrimethoxysilane, 3-aminopropyltriethoxysilane, 3-glycidoxypropyltrimethoxysilane, 3-glycidoxypropylmethyldimethoxysilane, 2-(3,4-epoxycyclohexy)ethyltrimethoxysilane, 3-chloropropylmethyldimethoxysilane, 3-chloropropyltrimethoxysilane, 3-methacryloxypropyltrimethoxysilane, 3-mercaptopropyltrimethoxysilane and the like: antioxidants such as 2,2-thiobis(4-methyl-6-t-butylphenol), 2,6-di-t-butylphenol and the like: ultraviolet absorbers such as 2-(3-t-butyl-5-methyl-2-hydroxyphenyl)-5-chlorobenzotriazole, alkoxybenzophenone and the like; and coagulation preventing agents such as sodium polyacrylate.

The photosensitive solution of the present invention which comprises a pigment as the colorant can be produced for example, by the following steps in sequence.

1) The pigment is dispersed by a beads mill until the average particle diameter becomes 0.2 $\mu$m or smaller. In this step, if desired, a pigment dispersing agent may be used, and a part of or whole of the binder resin may be compounded.

2) To the dispersed system (mill base) thus obtained, remaining binder resin, if any, and photopolymerizable monomer, photopolymerization initiator and other component are added, if desired. In this step, an additional solvent may be added to adjust the concentration. Thus, the desired photosensitive solution dispersing a pigment having a prescribed concentration can be obtained.

The obtained photosensitive solution dispersing a pigment is applied on a substrate, and the coated solution is dried to obtain a dried film. The dried film is subjected to a patterning exposure, then an development with alkali, followed by curing by heat to obtain a colored picture cell excellent in displaying properties such as color reproductivity and reliability. The color filter having the picture cell can be used in a liquid crystal color display and the like.

The patterning exposure is usually conducted by irradiating an ultraviolet ray through a mask for forming a desired picture cell. In the irradiation, preferably, a mask aligner or the like is used for irradiating a parallel ray uniformly on whole parts to be exposed.

The developer used in the patterning exposure is usually an aqueous solution containing an alkaline compound and a surfactant. The alkaline compound may be either an inorganic alkaline compound or an organic alkaline compound.

Specific examples of the inorganic alkaline compound include sodium hydroxide, potassium hydroxide, disodium hydrogenphosphate, sodium dihydrogenphosphate, diammonium hydrogenphosphate, ammonium dihydrogenphosphate, potassium dihydrogenphosphate, sodium silicate, potassium silicate, sodium carbonate, potassium carbonate, sodium hydrogen carbonate, potassium hydrogen carbonate, sodium borate, potassium borate and ammonia.

Specific examples of the organic alkaline compound include tetramethylammonium hydroxide, 2-hydroxyethyltrimethylammonium hydroxide, monomethyl amine, dimethyl amine, trimethyl amine, monoethyl amine, diethyl amine, triethyl amine, monoisopropyl amine, diisopropyl amine and ethanol amine.

The inorganic alkaline compound or organic alkaline compound may be used singly or in combination of two or more.

Concentration of the alkaline compound in an alkaline developer is preferably in a range of 0.01–10% by weight, more preferably 0.03–5% by weight.

The surfactant may be any of nonion surfactants, cation surfactants and anion surfactants. Specific examples of nonion surfactants include polyoxyethylenealkylether, polyoxyethylenearylether, polyoxyethylenealkylarylether, other polyoxyethylene derivatives, oxyethylene/oxypropylene block copolymer, sorbitan fatty acid ester, polyoxyethylene sorbitan fatty acid ester, polyoxyethylene sorbitol fatty acid ester, glycerin fatty acid ester, polyoxyethylene fatty acid ester and polyoxyethylene alkyl amine.

Specific examples of anion surfactants include higher alcohol sulfate ester salts, such as lauryl alcohol sodium sulfate and oleyl alcohol sodium sulfate, alkyl sulfate such as sodium lauryl sulfate and ammonium lauryl sulfate, and alkylaryl sulfate such as sodium dodecyl benzene sulfate and sodium dodecylnaphthalene sulfate.

Specific examples of cation surfactants include amine salts and quaternary ammonium salt, such as stearylamine hydrochloride and lauryl trimethylammonium chloride.

The surfactants may be used singly or in combination of two or more.

Concentration of the alkaline compound in an alkaline developer is usually in a range of 0.01–10% by weight, preferably 0.05–8% by weight, more preferably 0.1–5% by weight.

A picture cell having a color corresponding to the color of the pigment in the photosensitive solution can be obtained through the above steps, that is, applying the photosensitive solution, drying, patterning exposure on the dried film and development. A color filter can be obtained by repeating the series of steps for each of the colors required in the color filter. A color filter can be usually produced by arranging picture cells having red color, picture cells having green color and picture cells having blue color, on a substrate. By conducting a series of the above steps by using the photosensitive solution comprising a pigment of one of the three colors, picture cells having the color can be arranged on the substrate. Then, same procedures are conducted for the other colors. Thus, picture cells of the three colors can be arranged on the substrate.

By using a photosensitive solution of the present invention, a picture cell excellent in contrast, transmittance and surface roughness can be produced with good productivity. By incorporating this picture cell in a color liquid crystal display, a liquid crystal panel excellent in displaying properties such as color reproductivity and reliability can be produced.

The following examples illustrate the present invention more specifically. They do not restrict the scope of the present invention. In the examples, "%" and "parts" are weight basis unless otherwise stated.

EXAMPLE 1

A photosensitive solution having a formulation shown in Table 1 was prepared. In the solution, a glass substrate of a dimension of 2 cm by 2 cm was immersed. Then, the glass substrate was taken out from the solution, and dried in air at room temperature for one hour. The weight of the dried film on the glass substrate was 30 mg. The dried film was immersed in 10 ml of a mixed solvent having the same composition as shown in Table 1. The dried film was dissolved in the solution and a uniform green solution was obtained in 5 minutes.

Comparative Example 1

Example 1 was repeated except for using 80 parts of propyleneglycol mono-methyl ether acetate in place of the mixed solvent shown in Table 1, as the solvent for the photosensitive solution and the solvent for immersion.

The dried film peeled from the substrate, but a uniform green solution was not obtained. In the solution, green insoluble matters were observed even after 60 minutes.

TABLE 1

| Pigment | C. I. Pigment Green 36 | 5 parts |
|---|---|---|
| Binder polymer | Benzyl methacrylate/methacrylic acid copolymer (weight formulation 80/20. weight-average molecular weight 35,000) | 5.72 parts |
| Monomer | Dipentaerythritol hexaacrylate (Manufactured by Nippon Kayaku Co., Ltd.. "KAYARAD DPHA") | 5.72 parts |
| Photopolymerization initiator | Irgacure-907 (manufactured by CIBA-GEIGY) | 1.37 parts |
| | KAYACURE DETX-S (manufactured by Nippon Kayaku Co., Ltd.) | 0.69 parts |
| Additive | pigment dispersing agent | 1.5 parts |
| Solvent | propylene glycol monomethyl ether acetate | 64 parts |
| | ethyl 3-ethoxy propionate | 8 parts |
| | cyclohexane | 8 parts |

EXAMPLE 2

Spin coating was conducted by a spin coater equipped with a slit nozzle by using the photosensitive solution obtained in Example 1. Colored adhered matter was observed after coating the solution on 150 sheets.

Same spin coating as in Example 2 was conducted except for using the photosensitive solution obtained in Comparative example 1 in place of the photosensitive solution obtained in Example 1. Colored adhered matter was observed after coating the solution on 75 sheets.

In the present invention, a solvent is used which can dissolve a dried film formed from the photosensitive solution in 5 minutes or shorter when the dried film is immersed in the solvent, the amount of the solvent being 10 times by weight based on the amount of the dried film. By using the solvent, even when application of the solution is conducted with a coater of slit and spin system, formation of the dried colored matter adhered to a color filter can be suppressed, frequency of the washing can be reduced, and the productivity can be improved

What is claimed is:

1. A photosensitive solution comprising a colorant, a binder, a photoactive compound and a solvent, wherein the solvent can dissolve a dried film formed from a photosensitive solution in 5 minutes or shorter when the dried film is immersed in the solvent, the amount of the solvent being 10 times by weight based on the amount of the dried film.

2. The photosensitive solution according to claim 1 wherein the amount of the colorant is 5–60% by weight base on the total solid contents of the photosensitive solution.

3. The photosensitive solution according to claim 1 wherein the binder is a copolymer having a carboxyl group.

4. The photosensitive solution according to claim 3 wherein the copolymer having a carboxyl group has weight-average molecular weight measured by gel permeation chromatography converted to polystyrene of from 5000 to 400000.

5. The photosensitive solution according to claim 1 wherein the binder resin is used in an amount of from 5 to 90% by weight based on the total amount of all solid components.

6. The photosensitive solution according to claim 1 wherein the amount of the solvent used is from 50 to 90% by weight based on the amount of the whole photosensitive solution.

7. The photosensitive solution according to claim 1 wherein the photoactive compound is a mixture of a photopolymerization initiator and a phtopolymerizable monomer.

8. The photosensitive solution according to claim 7 wherein the amount of the photopolymerizable monomers is from 0.1 to 60 parts by weight based on 100 parts by weight of the total amount of a binder resin and the photopolymerizable monomers.

9. The photosensitive solution according to claim 7 wherein the amount of the amount of the photopolymerization initiator is from 3 to 30 parts by weight based on 100 parts by weight of the total amount of a binder polymers and the photopolymerizable monomer.

10. A color filter produced by using the photosensitive solution according to claim 1.

* * * * *